US012812884B2

(12) United States Patent
Hung et al.

(10) Patent No.: US 12,812,884 B2
(45) Date of Patent: Nov. 24, 2026

(54) METAL-INSULATOR-METAL CAPACITOR STRUCTURE HAVING INDEPENDENT CAPACITOR UNITS AND FABRICATION METHOD THEREOF

(71) Applicant: UNITED MICROELECTRONICS CORP., Hsin-Chu City (TW)

(72) Inventors: Ya-Jyuan Hung, Kaohsiung City (TW); Fu-Yu Tsai, Tainan City (TW)

(73) Assignee: UNITED MICROELECTRONICS CORP., Hsin-Chu City (TW)

( * ) Notice: Subject to any disclaimer, the term of this patent is extended or adjusted under 35 U.S.C. 154(b) by 352 days.

(21) Appl. No.: 18/588,016

(22) Filed: Feb. 27, 2024

(65) Prior Publication Data

US 2025/0248056 A1 Jul. 31, 2025

(30) Foreign Application Priority Data

Jan. 29, 2024 (CN) ........................ 202410123225.X

(51) Int. Cl.
*H10D 1/68* (2025.01)
*H10W 20/40* (2026.01)
*H10W 20/41* (2026.01)

(52) U.S. Cl.
CPC .......... *H10D 1/692* (2025.01); *H10W 20/435* (2026.01); *H10W 20/496* (2026.01)

(58) Field of Classification Search
CPC .. H10D 1/692; H10W 20/495; H10W 20/496; H10W 44/601; H10W 20/435
See application file for complete search history.

(56) References Cited

U.S. PATENT DOCUMENTS 6,765,255 B2 7/2004 Jin
7,015,110 B2 3/2006 Ning
7,732,296 B2 6/2010 Park
11,398,545 B2 7/2022 Lin
2004/0061164 A1* 4/2004 Houston .............. H10B 12/033 257/306
2004/0150021 A1* 8/2004 Nishikawa ............. H10D 1/694 257/296
2009/0130814 A1* 5/2009 Liu ........................ H10B 41/30 438/381
2015/0371899 A1* 12/2015 Zhang ................. C23C 18/1834 438/666
2020/0006352 A1* 1/2020 Avci ....................... H10B 10/12

* cited by examiner

*Primary Examiner* — Khiem D Nguyen
(74) *Attorney, Agent, or Firm* — Winston Hsu

(57) ABSTRACT

A metal-insulator-metal (MIM) capacitor structure includes a substrate having a conductor region thereon; and a plurality of independent capacitor units directly disposed on the conductor region. Each of the plurality of independent capacitor units includes a first capacitor electrode wrapped around by a capacitor dielectric layer, and a second capacitor electrode surrounding the capacitor dielectric layer and the first capacitor electrode.

14 Claims, 7 Drawing Sheets

METAL-INSULATOR-METAL CAPACITOR STRUCTURE HAVING INDEPENDENT CAPACITOR UNITS AND FABRICATION METHOD THEREOF

BACKGROUND OF THE INVENTION

1. Field of the Invention

The present invention relates to the field of semiconductor technology, and in particular to a three-dimensional (3D) metal-insulator-metal (MIM) capacitor structure and a manufacturing method thereof.

2. Description of the Prior Art

Metal-insulator-metal (MIM) capacitor structures are a commonly used capacitor structure in integrated circuits, which can reduce the parasitic resistance, thereby increasing resonant frequency of a component. Typically, MIM capacitor structures are often used in high-frequency devices.

MIM capacitor structures are formed in the back-end metal process (BEOL) stage, and they are typically two-dimensional capacitor structures. However, a larger chip area is needed to increase the capacitance value. It is desirable to provide an improved MIM capacitor structure in order to increase the flexibility of circuit design of an integrated circuit chip.

SUMMARY OF THE INVENTION

It is one object of the present invention to provide an improved metal-insulator-metal (MIM) capacitor structure and a manufacturing method thereof to solve the deficiencies or shortcomings of the existing technology.

One aspect of the invention provides a MIM capacitor structure including a substrate having a conductor region thereon; and a plurality of independent capacitor units directly disposed on the conductor region. Each of the plurality of independent capacitor units comprises a first capacitor electrode wrapped around by a capacitor dielectric layer, and a second capacitor electrode surrounding the capacitor dielectric layer and the first capacitor electrode.

According to some embodiments, the second capacitor electrode is in direct contact with the conductor region.

According to some embodiments, the conductor region comprises copper.

According to some embodiments, the MIM capacitor structure further comprises a plurality of spacers disposed between the plurality of independent capacitor units.

According to some embodiments, the plurality of spacers comprises silicon oxide.

According to some embodiments, the MIM capacitor structure further comprises an etching stop layer covering the plurality of independent capacitor units and the plurality of spacers.

According to some embodiments, the etching stop layer comprises silicon nitride or silicon carbonitride.

According to some embodiments, the etching stop layer extends onto a top surface of the conductor region.

According to some embodiments, the capacitor dielectric layer has a U-shaped cross-sectional profile.

According to some embodiments, the first capacitor electrode and the second capacitor electrode comprise titanium nitride, tantalum nitride, or tungsten.

Another aspect of the invention provides a method for forming a MIM capacitor structure. A substrate having a conductor region thereon is provided. A plurality of independent capacitor units is formed directly on the conductor region. Each of the plurality of independent capacitor units comprises a first capacitor electrode wrapped around by a capacitor dielectric layer, and a second capacitor electrode surrounding the capacitor dielectric layer and the first capacitor electrode.

According to some embodiments, the second capacitor electrode is in direct contact with the conductor region.

According to some embodiments, the conductor region comprises copper.

According to some embodiments, the method further comprises the step of forming a plurality of spacers between the plurality of independent capacitor units.

According to some embodiments, the plurality of spacers comprises silicon oxide.

According to some embodiments, the method further comprises the step of forming an etching stop layer on the plurality of independent capacitor units and the plurality of spacers.

According to some embodiments, the etching stop layer comprises silicon nitride or silicon carbonitride.

According to some embodiments, the etching stop layer extends onto a top surface of the conductor region.

According to some embodiments, the capacitor dielectric layer has a U-shaped cross-sectional profile.

According to some embodiments, the first capacitor electrode and the second capacitor electrode comprise titanium nitride, tantalum nitride, or tungsten.

These and other objectives of the present invention will no doubt become obvious to those of ordinary skill in the art after reading the following detailed description of the preferred embodiment that is illustrated in the various figures and drawings.

DETAILED DESCRIPTION

In the following detailed description of the disclosure, reference is made to the accompanying drawings, which form a part hereof, and in which is shown, by way of illustration, specific embodiments in which the invention may be practiced. These embodiments are described in sufficient detail to enable those skilled in the art to practice the invention.

Other embodiments may be utilized, and structural, logical, and electrical changes may be made without departing from the scope of the present invention. Therefore, the following detailed description is not to be considered as limiting, but the embodiments included herein are defined by the scope of the accompanying claims.

Figure 1:
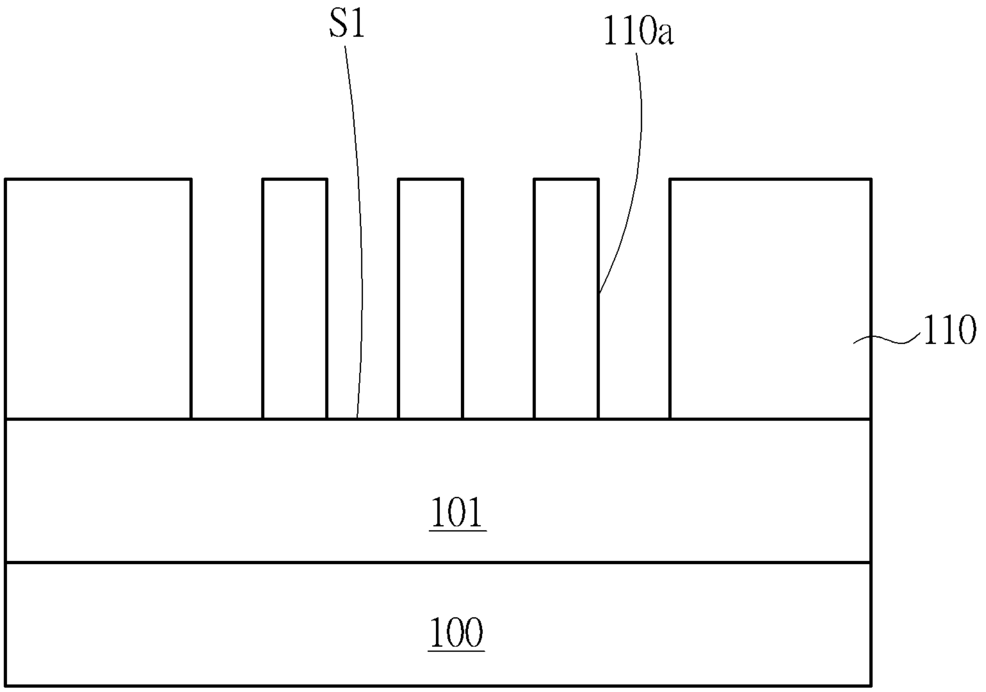
FIG. 1 to FIG. 13 are schematic cross-sectional diagrams showing an exemplary method of forming a metal-insulator-metal capacitor structure according to an embodiment of the present invention.

Please refer to FIG. 1 to FIG. 13, which are schematic cross-sectional diagrams showing an exemplary method of forming a metal-insulator-metal (MIM) capacitor structure according to an embodiment of the present invention. As shown in FIG. 1, a substrate 100 is first provided. The substrate 100 may be, for example, a silicon substrate, but is not limited thereto. According to an embodiment of the present invention, the substrate 100 may include a dielectric layer and circuit elements formed on the substrate 100, such as transistors or the like. For the sake of simplicity, these dielectric layers and circuit elements are not shown in the figures.

According to an embodiment of the present invention, a conductor region 101 is formed on the substrate 100. According to an embodiment of the present invention, for example, the conductor region 101 may be a copper metal layer, but is not limited thereto. The conductor region 101 may be comprised of other conductive materials, such as polysilicon or doped regions.

Subsequently, a chemical vapor deposition (CVD) process may be performed to deposit a dielectric layer 110 on the conductor region 101. For example, the dielectric layer 110 may be a silicon oxide layer, but is not limited thereto. A photolithography process and an etching process are then performed to form a plurality of trenches 110*a* in the dielectric layer 110. According to an embodiment of the present invention, the trench 110*a* penetrates the entire thickness of the dielectric layer 110 and exposes part of the top surface S1 of the conductor region 101.

Figure 2:
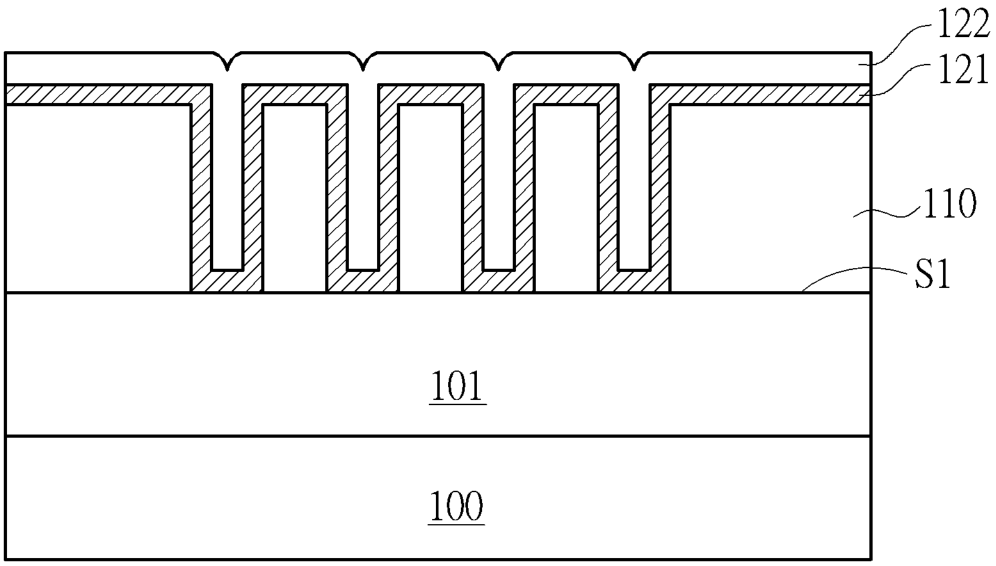

As shown in FIG. 2, a chemical vapor deposition process, such as an atomic layer deposition (ALD) process, is then performed to conformally deposit a capacitor dielectric layer 121 on the dielectric layer 110 and in the trenches 110*a*. For example, the capacitor dielectric layer 121 may comprise aluminum oxide, zirconium oxide, or other high dielectric constant (high-k) material layers. A first capacitor electrode 122 is then conformally deposited on the capacitor dielectric layer 121. According to an embodiment of the present invention, the capacitor dielectric layer 121 and the first capacitor electrode 122 completely fill the trenches 110*a*. According to an embodiment of the present invention, for example, the first capacitor electrode 122 may include titanium nitride, tantalum nitride or tungsten, but is not limited thereto.

Figure 3:
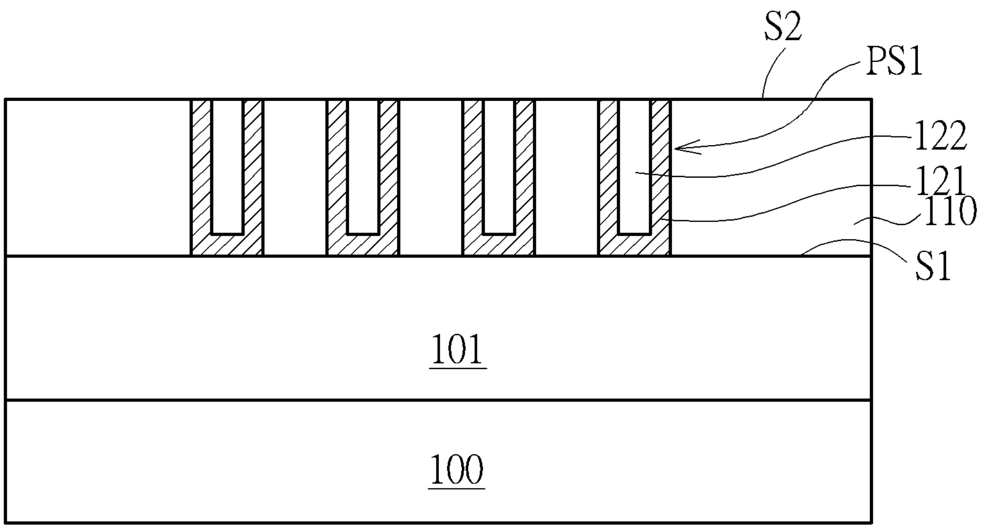

As shown in FIG. 3, a chemical mechanical polishing (CMP) process is then performed to polish away the first capacitor electrode 122 and the capacitor dielectric layer 121 outside the trenches 110*a* and the top surface S2 of the dielectric layer 110 is exposed at this point. As can be seen from FIG. 3, the capacitor dielectric layer 121 has a U-shaped cross-sectional profile and the capacitor dielectric layer 121 wraps the first capacitor electrode 122. The capacitor dielectric layer 121 is in direct contact with the top surface S1 of the conductor region 101.

Figure 4:
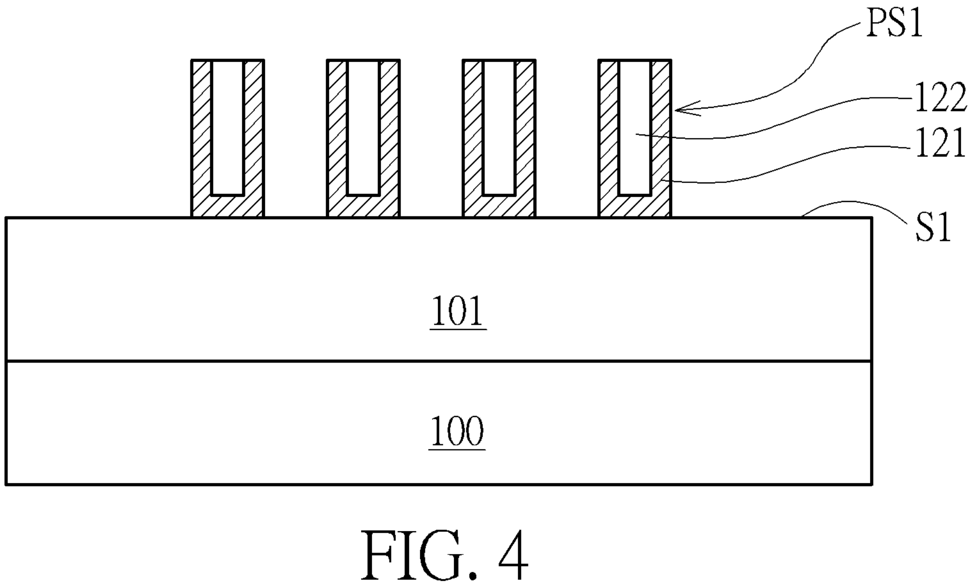

As shown in FIG. 4, an etching process can then be performed to remove the remaining dielectric layer 110, leaving the capacitor dielectric layer 121 and the first capacitor electrode 122 located on the top surface S1 of the conductor region 101 intact. According to an embodiment of the present invention, the capacitor dielectric layer 121 and the first capacitor electrode 122 protrude upward from the top surface S1 of the conductor region 101 to form a plurality of independent column-shaped structures PS1 spaced apart from each other.

Figure 5:
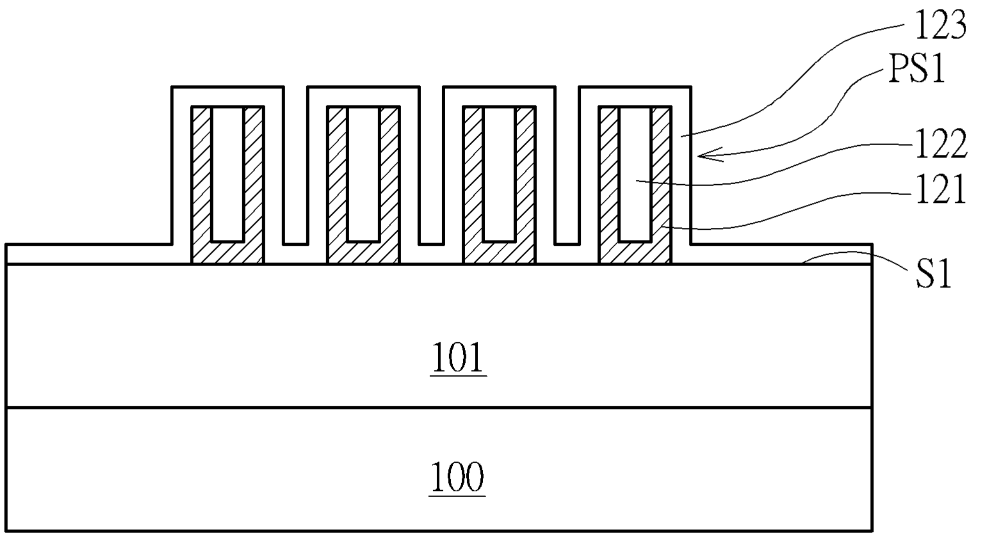

As shown in FIG. 5, a chemical vapor deposition process, such as an atomic layer deposition process, may be performed to form a conductive layer 123, such as titanium nitride, tantalum nitride or tungsten, conformally on the conductor region 101 and the column structure PS1. At this point, the gaps between the column-shaped structures PS1 are not filled by the conductive layer 123.

Figure 6:
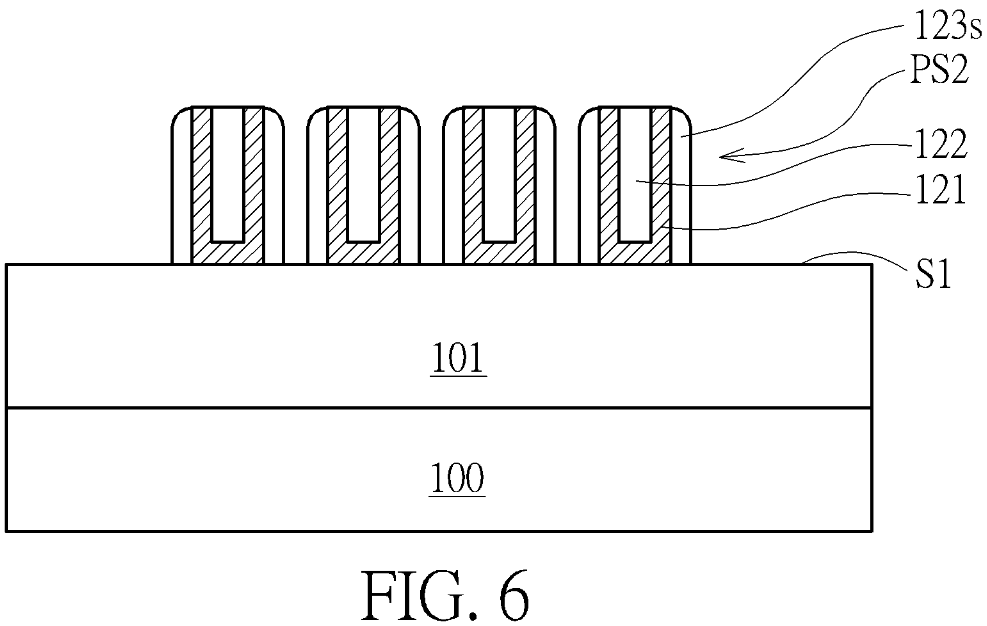

As shown in FIG. 6, an anisotropic dry etching process is performed to etch the conductive layer 123 to form a second capacitor electrode 123*s* surrounding the column structures PS1 on the sidewalls of the column-shaped structures PS1. According to an embodiment of the present invention, the second capacitor electrode 123*s* may include titanium nitride, tantalum nitride or tungsten. The capacitor dielectric layer 121, the first capacitor electrode 122 and the second capacitor electrode 123*s* constitute a plurality of mutually independent column-shaped capacitor units PS2. According to an embodiment of the present invention, the second capacitor electrode 123*s* is electrically isolated from the first capacitor electrode 122 by the capacitor dielectric layer 121. According to an embodiment of the present invention, the second capacitor electrode 123*s* is in direct contacts the top surface S1 of the conductor region 101.

Figure 7:
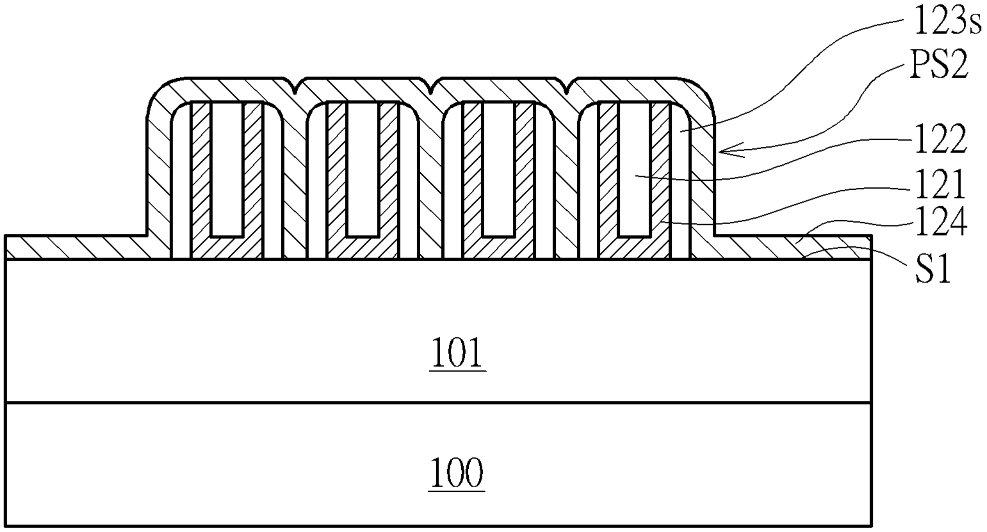

As shown in FIG. 7, a chemical vapor deposition process is then performed to conformally deposit an insulating layer 124, for example, a silicon oxide layer, on the column-shaped capacitor units PS2 in a blanket manner. At this point, the gaps between the column-shaped capacitor units PS2 may be filled with the insulating layer 124.

Figure 8:
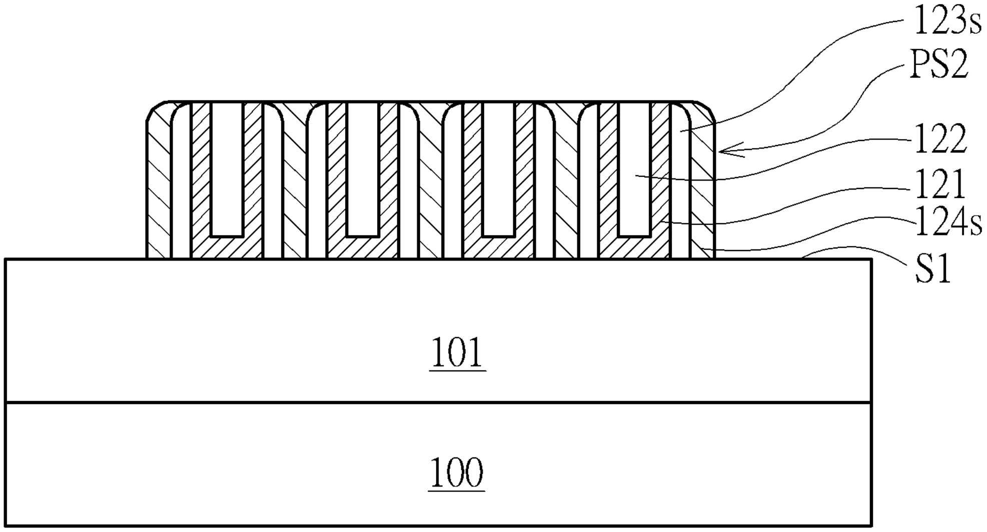

As shown in FIG. 8, an anisotropic dry etching process is performed to etch the insulating layer 124 to form a plurality of spacers 124*s* surrounding the column-shaped capacitor structures PS2 along the sidewalls of the column-shaped capacitor units PS2. According to an embodiment of the present invention, the column-shaped capacitor units PS2 are isolated from one another by the spacers 124*s*. According to an embodiment of the present invention, the spacers 124*s* may comprise silicon oxide.

Figure 9:
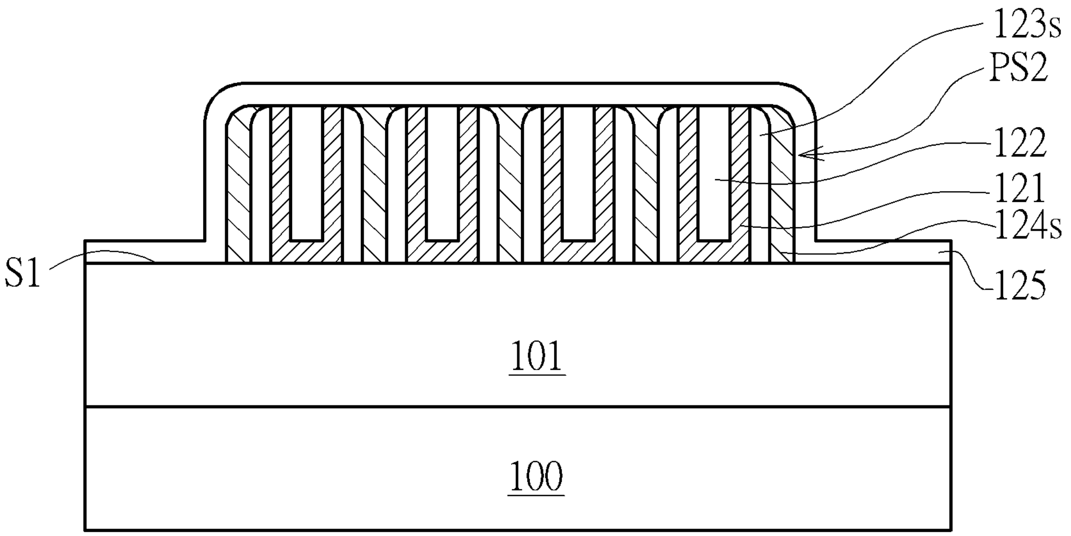

As shown in FIG. 9, a chemical vapor deposition process is then performed to conformally deposit an etching stop layer 125 on the column-shaped capacitor units PS2 and the spacers 124*s*. According to an embodiment of the present invention, the etching stop layer 125 may comprise silicon nitride or silicon carbonitride, but is not limited thereto. According to an embodiment of the present invention, the etching stop layer 125 extends onto the top surface S1 of the conductor region 101.

Figure 10:
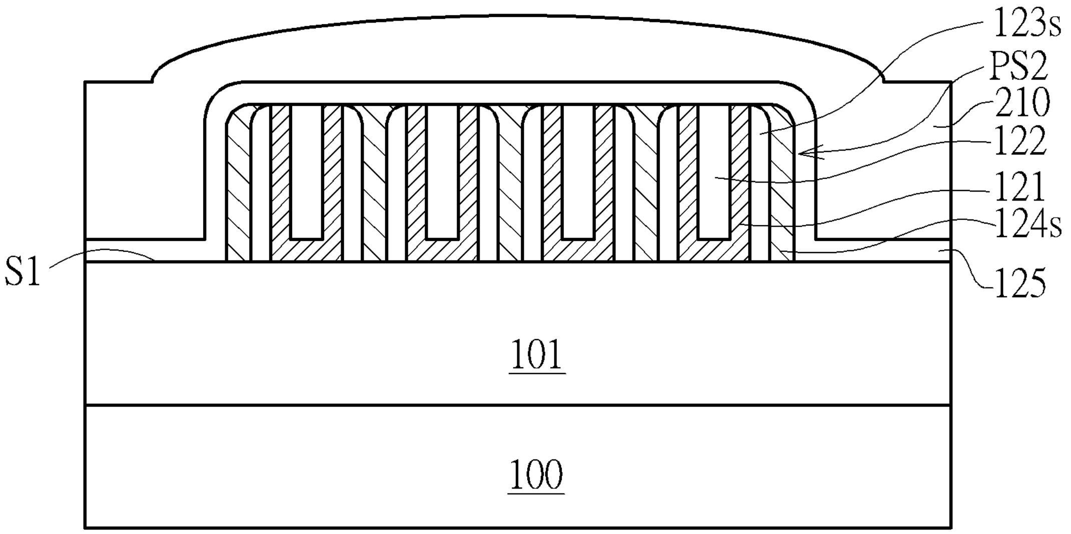

As shown in FIG. 10, a chemical vapor deposition process is then performed to deposit a dielectric layer 210 on the substrate 100 in a blanket manner. For example, the dielectric layer 210 may be a silicon oxide layer or a low dielectric constant material layer. According to an embodiment of the invention, the dielectric layer 210 covers the etching stop layer 125.

Figure 11:
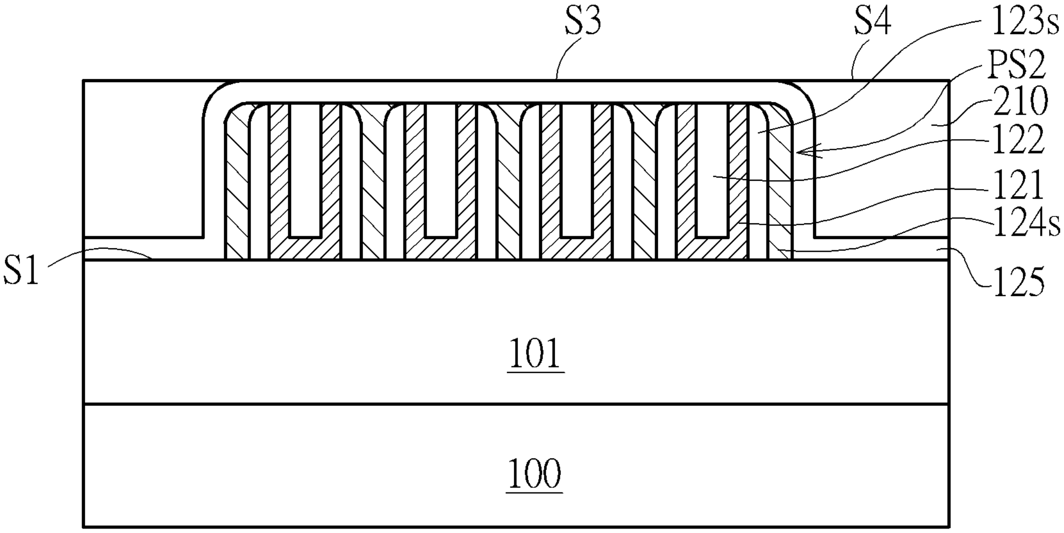

As shown in FIG. 11, a chemical mechanical polishing process is then performed to polish away part of the dielectric layer 210 until the etching stop layer 125 is exposed. At this point, the top surface S3 of the etching stop layer 125 is flush with the top surface S4 of the dielectric layer 210.

Figure 12:
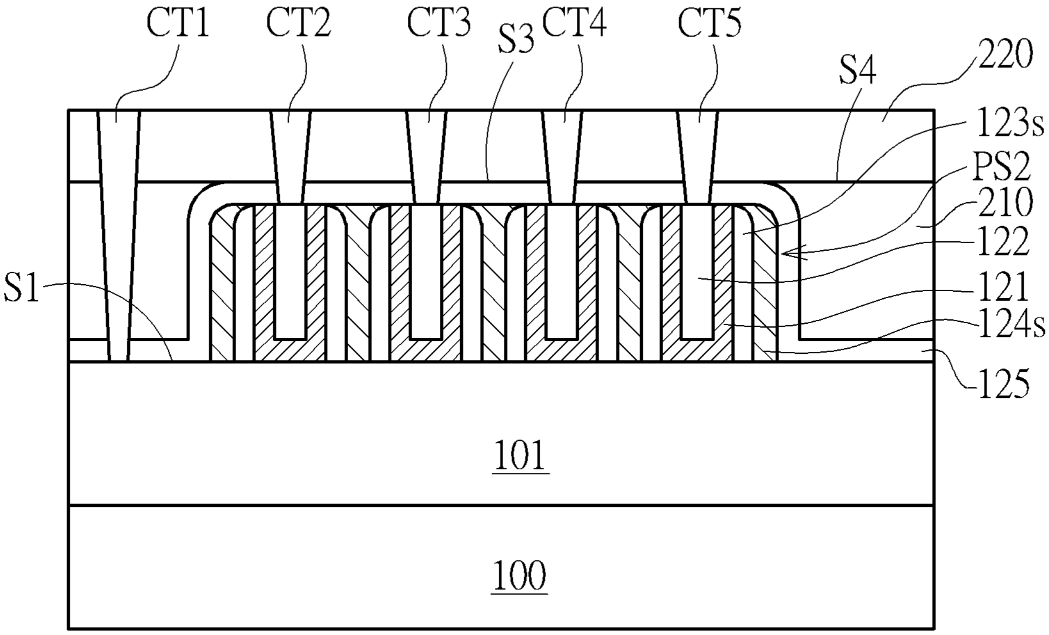

As shown in FIG. 12, a chemical vapor deposition process is then performed to deposit a dielectric layer 220, such as a silicon oxide layer or a low-k material layer, on the substrate 100 in a blanket manner. A metal interconnection process is then performed to form contact plugs CT1-CT5 in the dielectric layer 220, the dielectric layer 210 and the etching stop layer 125. According to an embodiment of the present invention, the contact plug CT1 penetrates the dielectric layer 220, the dielectric layer 210 and the etching stop layer 125 and is electrically connected to the conductor region 101. The contact plugs CT2-CT5 penetrate the dielectric layer 220 and the etching stop layer 125 and are electrically connected to the corresponding first capacitor electrodes 122 respectively.

Figure 13:
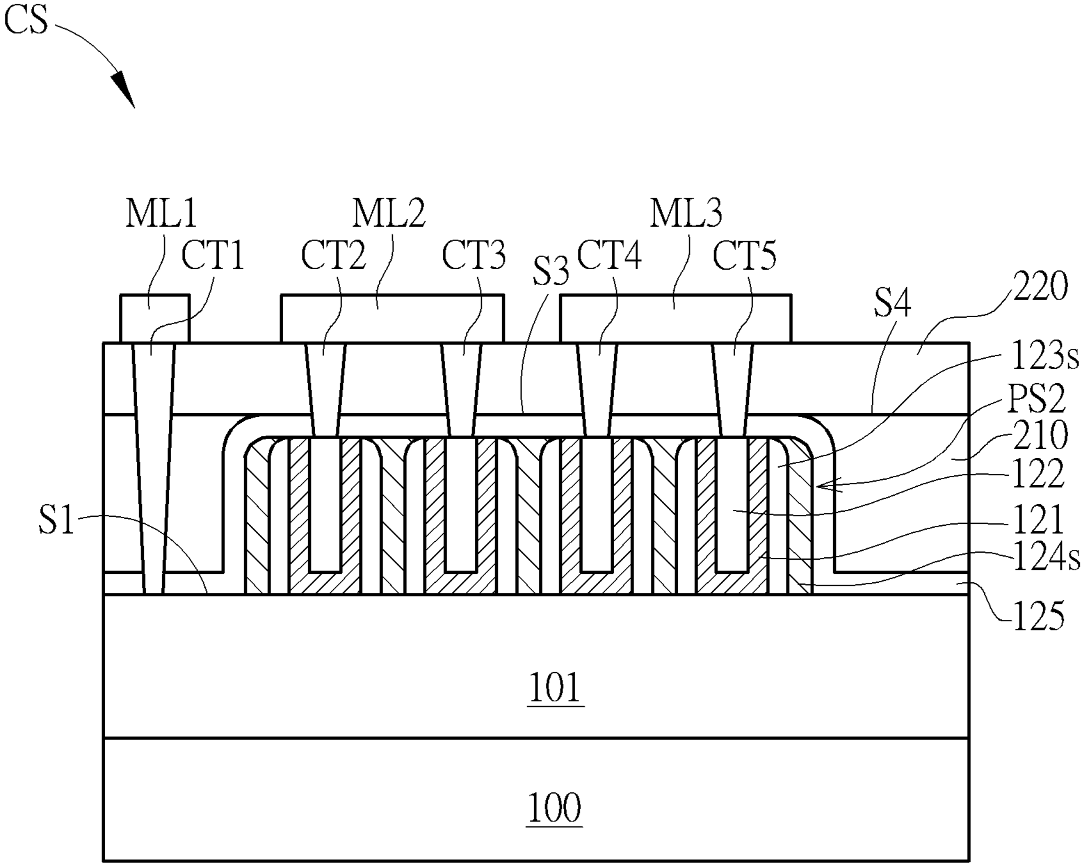

As shown in FIG. 13, a metallization process is then performed to form metal wires ML1-ML3 on the dielectric layer 220. According to an embodiment of the present invention, the metal wire ML1 is electrically connected to the contact plug CT1. According to an embodiment of the present invention, the metal wire ML2 can be electrically connected to the contact plugs CT2 and CT3, and the metal wire ML3 can be electrically connected to the contact plugs CT4 and CT5. It should be understood that the above metal wire connection methods are for illustration purposes only and can be flexibly configured according to actual design requirements.

Structurally, as shown in FIG. 13, the metal-insulator-metal (MIM) capacitor structure CS of the present invention includes: a substrate 100 with a conductor region 101 thereon; and a plurality of independent capacitor units PS2, which are directly disposed on the conductor region 101. Each of the plurality of independent capacitor units PS2 includes a first capacitor electrode 122 wrapped by a capacitor dielectric layer 121, and a second capacitor electrode 123*s* surrounding the capacitor dielectric layer 121 and the first capacitor electrode 122. According to an embodiment of the present invention, the second capacitor electrode 123*s* is in direct contact with the conductor region 101. According to an embodiment of the invention, conductor region 101 may include copper.

According to an embodiment of the present invention, the MIM capacitor structure CS further includes spacers 124*s* disposed between the independent capacitor units PS2. According to an embodiment of the present invention, the spacers 124*s* may include silicon oxide. According to an embodiment of the present invention, the MIM capacitor structure CS further includes: an etching stop layer 125 covering the independent capacitor units PS2 and the spacers 124*s*. According to an embodiment of the present invention, the etching stop layer 125 may include silicon nitride or silicon carbonitride. According to an embodiment of the present invention, the etching stop layer 125 extends onto the top surface S1 of the conductor region 101.

According to an embodiment of the present invention, the capacitive dielectric layer 121 has a U-shaped cross-sectional profile. According to an embodiment of the present invention, the first capacitor electrode 122 and the second capacitor electrode 123*s* may include titanium nitride, tantalum nitride or tungsten.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A metal-insulator-metal (MIM) capacitor structure, comprising:

a substrate having a conductor region thereon;

a plurality of independent capacitor units directly disposed on the conductor region, wherein each of the plurality of independent capacitor units comprises a first capacitor electrode wrapped around by a capacitor dielectric layer, and a second capacitor electrode surrounding the capacitor dielectric layer and the first capacitor electrode, wherein a bottom of the capacitor dielectric layer directly contacts the conductor region;

a plurality of spacers disposed between the plurality of independent capacitor units; and an etching stop layer covering the plurality of independent capacitor units and the plurality of spacers, wherein the etching stop layer extends onto a top surface of the conductor region.

2. The MIM capacitor structure according to claim 1, wherein the second capacitor electrode is in direct contact with the conductor region.

3. The MIM capacitor structure according to claim 1, wherein the conductor region comprises copper.

4. The MIM capacitor structure according to claim 1, wherein the plurality of spacers comprises silicon oxide.

5. The MIM capacitor structure according to claim 1, wherein the etching stop layer comprises silicon nitride or silicon carbonitride.

6. The MIM capacitor structure according to claim 1, wherein the capacitor dielectric layer has a U-shaped cross-sectional profile.

7. The MIM capacitor structure according to claim 1, wherein the first capacitor electrode and the second capacitor electrode comprise titanium nitride, tantalum nitride, or tungsten.

8. A method for forming a metal-insulator-metal (MIM) capacitor structure, comprising:

providing a substrate having a conductor region thereon;

forming a plurality of independent capacitor units directly on the conductor region, wherein each of the plurality of independent capacitor units comprises a first capacitor electrode wrapped around by a capacitor dielectric layer, and a second capacitor electrode surrounding the capacitor dielectric layer and the first capacitor electrode, wherein a bottom of the capacitor dielectric layer directly contacts the conductor region;

forming a plurality of spacers between the plurality of independent capacitor units; and forming an etching stop layer on the plurality of independent capacitor units and the plurality of spacers, wherein the etching stop layer extends onto a top surface of the conductor region.

9. The method according to claim 8, wherein the second capacitor electrode is in direct contact with the conductor region.

10. The method according to claim 8, wherein the conductor region comprises copper.

11. The method according to claim 8, wherein the plurality of spacers comprises silicon oxide.

12. The method according to claim 8, wherein the etching stop layer comprises silicon nitride or silicon carbonitride.

13. The method according to claim 8, wherein the capacitor dielectric layer has a U-shaped cross-sectional profile.

14. The method according to claim 8, wherein the first capacitor electrode and the second capacitor electrode comprise titanium nitride, tantalum nitride, or tungsten.

* * * * *